United States Patent
Abraham et al.

(10) Patent No.: US 6,362,655 B1
(45) Date of Patent: Mar. 26, 2002

(54) LINEAR ACTIVE RESISTOR AND DRIVER CIRCUIT INCORPORATING THE SAME

(75) Inventors: Isaac P. Abraham, Kent; David R. Johnson, Olympia, both of WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/714,054

(22) Filed: Nov. 15, 2000

(51) Int. Cl.[7] .................................. H03K 19/0175
(52) U.S. Cl. ..................... 326/83; 326/86; 326/30; 326/90; 327/108; 327/112
(58) Field of Search .................. 326/30, 86, 83, 326/90; 327/108, 112

(56) References Cited

U.S. PATENT DOCUMENTS

| | | |
|---|---|---|
| 5,391,939 A | 2/1995 | Nonaka |
| 5,841,702 A | 11/1998 | Kim |
| 6,069,491 A * | 5/2000 | Muller et al. .................. 327/70 |
| 6,087,853 A * | 7/2000 | Huber et al. .................. 326/83 |
| 6,194,945 B1 * | 2/2001 | Bahramzadeh .............. 327/333 |
| 6,222,389 B1 * | 4/2001 | Williams ..................... 326/86 |

* cited by examiner

Primary Examiner—Michael Tokar
Assistant Examiner—V. Tan
(74) Attorney, Agent, or Firm—Blakely, Sokoloff, Taylor & Zafman LLP

(57) ABSTRACT

An active resistor design is adapted to implement a linearized transistor driver that includes a first FET coupled between a supply potential and an output node, with the gate of the first FET being coupled to an input node. Second and third FETs are coupled between the output node and a reference potential, with the gate of the second FET being coupled to the input node. A switching circ

19 Claims, 3 Drawing Sheets

LINEAR ACTIVE RESISTOR AND DRIVER CIRCUIT INCORPORATING THE SAME

RELATED APPLICATIONS

The present application is related to Ser. No. 09/608,529 filed Jun. 30, 2000 entitled, "Dynamically Updating Impedance Compensation Code for Input and Output Drivers"; Ser. No. 09/476,425 filed Dec. 30, 1999 entitled, "A Constant CMOS Driver"; and Ser. No. 09/108,606 filed Jul. 1, 1998 entitled, "A CMOS Driver", which applications are assigned to the assignee of the present application.

FIELD OF THE INVENTION

The present invention relates generally to the field of integrated circuits; more particularly, to methods and apparatus for implementing active resistors for use in driver circuitry.

BACKGROUND OF THE INVENTION

Advances in integrated circuit technology have produced a trend toward the use of low voltage differential signaling and high-speed terminated buses. This development, in turn, has placed greater importance on the implementation of precise, on-die linear resistors and circuit designs capable of driving signals with an output impedance that matches the characteristic impedance of the terminated buses. In the past, linear resistors have been used in integrated circuits as constant impedance drivers and terminators for buses. In addition, linear resistors find use as resistive elements for digital-to-analog converters (DACs) and as active loads for amplifiers.

In prior applications requiring constant impedance drivers, it has been the practice to use discrete resistors coupled in series with a switching device that has almost zero resistance. The drawback of this approach is that the driver transistor that forms the switching device is required to be very large in order to minimize "on" resistance. Obviously, a very large device size is costly in terms of silicon layout area. Additionally, the added gate and source-drain capacitance associated with a large device hinders high-speed performance.

In standard complementary metal oxide semiconductor (CMOS) technology, on-die resistors can be created using transistors operated in the so-called "linear region". In reality, however, the degree of linearity that can be achieved is limited by the inherent non-linearity present in the drain-source current equation of the transistor. That is, the physical nature of the field-effect transistor causes the current versus voltage relationship of the device to deviate from an ideal straight line. As bus speeds increase and signal swings decrease, deviations from linearity in driver and terminator circuits can become a major problem affecting signal integrity. By way of example, even though the driver circuitry described in the related applications listed above provide an overall improvement in linearity, the percentage deviation of the active resistor designs from the ideal (i.e., a straight line) remains unacceptably large at low drain-source voltages.

Therefore, what is needed is a circuit that achieves better linearity, and which could be used to create on-die termination resistors for conventionally terminated bus schemes and/or low voltage differential signaling (LVDS) technologies, or any analog application requiring precision resistors.

BRIEF DESCRIPTION OF THE DRAWINGS

The present invention will be understood more fully from the detailed description which follows and from the accompanying drawings, which however, should not be taken to limit the invention to the specific embodiments shown, but are for explanation and understanding only.

DETAILED DESCRIPTION

A linear active resistor and a driver device incorporating the same are described. In the following description, numerous details are set forth, such as specific circuit configurations, device sizes, equations, etc., in order to provide a thorough understanding of the invention. It will be clear, however, to one skilled in the art, that these specific details may not be needed to practice the present invention.

Figure 1:
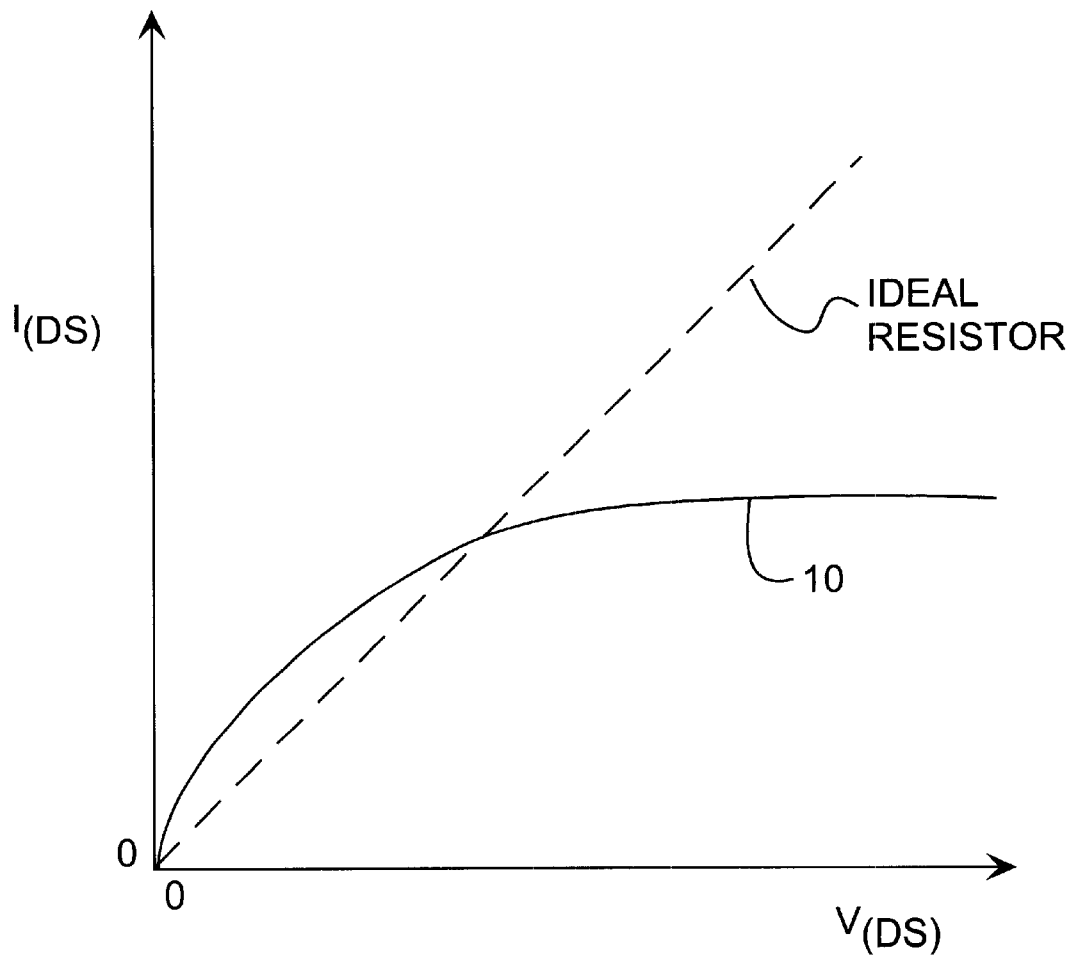
FIG. 1 is a graph showing the current versus voltage characteristics of a typical prior art transistor as compared with an ideal resistor.

With reference to FIG. 1, there is shown a graph showing the current versus voltage characteristics of a typical prior art transistor as compared with an ideal resistor. The vertical axis represents drain-source current ($I_{DS}$) and the horizontal axis represents drain-source voltage ($V_{DS}$). The ideal resistor presents constant impedance to any voltage impressed across its terminals. The characteristics of a perfect resistor are constant instantaneous impedance and constant rate of change of target impedance. Impedance is thus independent of the operating point chosen. This characteristic is shown in FIG. 1 by the dashed straight line, which is defined by equation (1) below.

$$Y = mX \qquad \text{Equation (1)}$$

The current versus voltage characteristic of a field effect transistor is shown by curve 10 in FIG. 1. This curve is typically described as consisting of a so-called "linear" region, where the device is operated at low drain-source voltages, and a saturation region or mode of operation, where current changes more gradually at higher drain-source voltages. The equation that describes the linear region of the transistor is given as $$I_{DS} = \mu_N C_{OX}(W/L)\{(V_{GS} - V_t)V_{DS} - 0.5 V_{DS}^2\} \qquad \text{Equation (2)}$$

where $\mu_N$ is a mobility constant, $C_{OX}$ is the gate oxide capacitance, W and L are the respective width and length of the device, $V_t$ is the transistor threshold voltage, and $V_{GS}$ is the gate-source voltage. As can be seen, equation (2) is not a linear equation due to the dependence of $I_{DS}$ on the squared $V_{DS}$ term.

In a saturation mode of operation, the current versus voltage relationship is described by equation (3) below.

$$I_{DS}(\text{sat}) = \mu_N C_{OX}(W/L)(V_{GS} - V_t)^2 (1 + \lambda V_{DS}) \qquad \text{Equation (3)}$$

(It is appreciated that in input/output (I/O) circuits, non-minimum length devices are usually used. Therefore the channel length modulation factor is neglected in all device equations since it does not play an important role in non-minimum length transistors.)

In an integrated circuit (IC) environment, the operating point for an I/O pin is constantly shifting as the signal switches between stable voltage states. Ideally, a driver or terminator subjected to a varying voltage across its output node (i.e., pin or pad) should still present the target impedance to the signal across its full voltage swing range. For applications where the IC drives a bus or transmission line maintaining target impedance is critical to successfully achieving impedance matching. Impedance matching, in turn, ensures maximum power transfer from the driver to the receiver and enhances signal integrity by eliminating reflections. Impedance matching is also important to maintaining design target logical high/low output voltage levels.

The method of the present invention basically employs multiple transistors operating in their linear and saturation modes to achieve the desired linearity by summation and subtraction of currents into a node. This approach is illustrated mathematically and also in an example driver circuit, as described in detail shortly.

Referring back to equation (2), the terms of that equation may be expanded, resulting in equation (4) below.

$$I_{DS}=\mu_N C_{OX}(W/L)(V_{GS}-V_t)V_{DS}-0.5\mu_N C_{OX}(W/L)V_{DS}^2 \quad \text{Equation (4)}$$

It is evident that the second, right-hand side term of the above equation is what introduces the non-linearity. According to the present invention, linearity is achieved in an active resistor by a circuit structure that effectively cancels out this second term. In an integrated circuit, the novel approach of the present invention is to distribute the total current into an output node (for a given drain-source voltage) between transistor devices operating in linear and saturation regions.

Since in a saturated device the drain-gate is effectively shorted ($V_{GS}=V_{DS}$), a summation of the currents into a given node by linear and saturated devices results in $$I_{DS}=\mu_N C_{OX}(W/L)[(V_{GS}-2V_t)V_{DS}]+0.5\mu_N C_{OX}(W/L)V_t^2 \quad \text{Equation (5)}$$

which is in the form of a standard equation of a straight line with an undesirable intercept on the y-axis, as shown in equation (6) below.

$$I_{DS}=mV_{DS}+C \quad \text{Equation (6)}$$

According to the present invention, this undesirable extra term is removed by subtracting it from equation (5). In an integrated circuit design, subtraction amounts to sourcing a constant current equal to the y-axis intercept constant C of equation (6).

Figure 2:
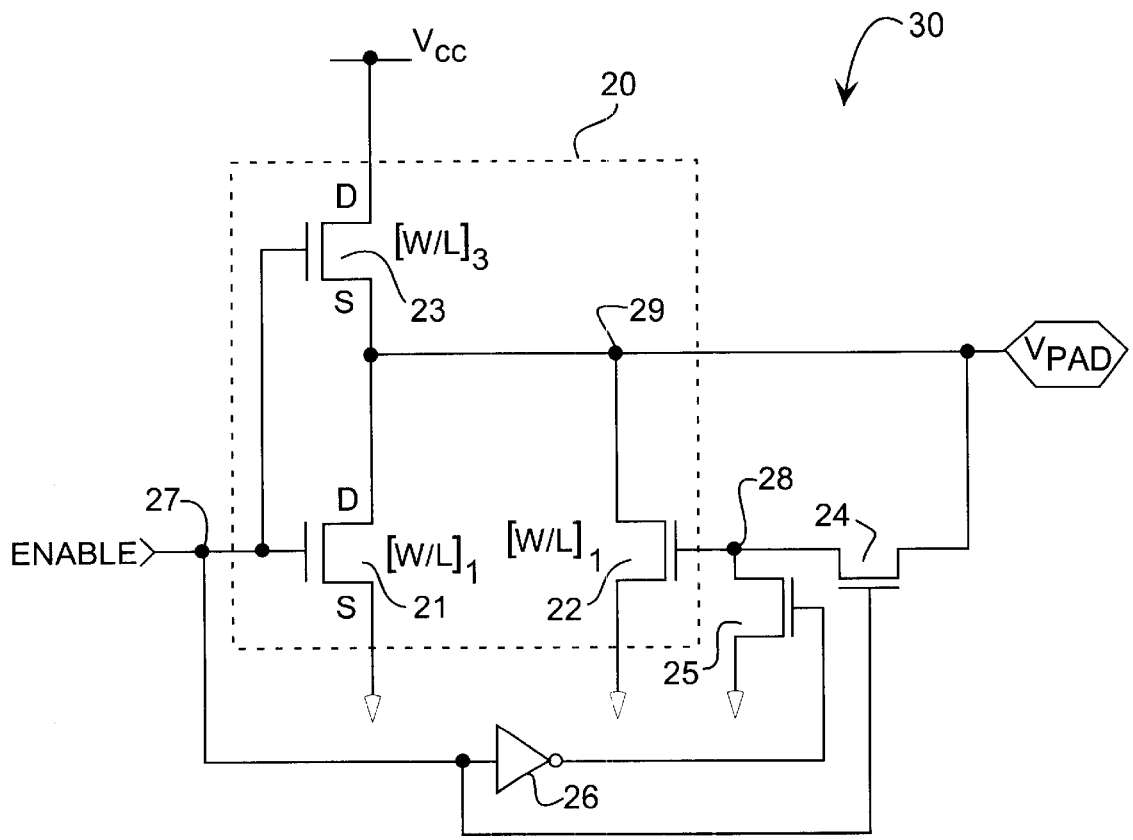
FIG. 2 is a circuit schematic diagram of a driver circuit incorporating a linear active resistor in accordance with one embodiment of the present invention.

FIG. 2 is a circuit schematic diagram of a driver circuit 30 incorporating a linear active resistor in accordance with one embodiment of the present invention. The linear active resistor structure 20 incorporated within driver 30 comprises NMOS field-effect transistors (FETs) 21–23. (It is appreciated that other embodiments or implementations may employ PMOS devices.) Transistor 22 is shown coupled between output node 29 and a reference potential such as ground (or $V_{SS}$). Output node 29 represents the pad or I/O pin of the IC. When coupled to a standard bus or transmission line, the voltage appearing at node 29 ($V_{PAD}$) varies over the full voltage swing range. The gate of transistor 22 is coupled to node 28, which switches between $V_{PAD}$ and ground depending on whether the driver is turned on or off by the enable signal provided at input node 27. When driver 30 is turned on, transistor 22 operates in a saturation mode or region.

Transistor 21 is an NMOS FET having its drain connected to output node 29, its source grounded, and its gate connected to input node 27. When node 27 is at a logical high voltage (e.g., $V_{CC}$) transistor 21 is in a linear mode of operation. Note that both transistors 21 and 22 have a device size $(W/L)_1$.

Transistor 23 is included in circuit schematic of FIG. 2 to provide a source of constant current into node 29 to offset the constant term (see equations 5 & 6) produced by the linear and saturated transistor devices 21 and 22. Transistor 23 is shown coupled between the positive supply potential $V_{CC}$ and output node 29, with a device size $(W/L)_2$. The device size of the constant current generator transistor 23 is determined by equating the term C to the current of a saturated NMOS device, as shown below.

$$0.5\mu_N C_{OX}(W/L)_2(V_{GS}-V_t)^2=0.5\mu_N C_{OX}(W/L)_1 V_t^2 \quad \text{Equation (7)}$$

Solving for device size $(W/L)_2$ yields:

$$(W/L)_2=(W/L)_1 V_t^2/(V_{GS}-V_t)^2 \quad \text{Equation (8)}$$

Thus, by selecting a correct size relationship between transistors 21–23 used to implement active resistor 20, the net current into the node results in a linearized I-V curve.

NMOS transistors 24 and 25 serve to adapt the active resistor structure to function as a bus driver. This is accomplished by using an NMOS pass gate to the saturated driver transistor 22, activated using a complemented enable signal. This is illustrated in FIG. 2 by transistor 24 being coupled between node 29 and node 28, with the gate of transistor 24 being coupled to input node 27. Transistor 25 is coupled between node 28 and ground to discharge the gate of transistor 22 when the resistor is to be disabled. The gate of transistor 25 is driven by the output of the inverter 26. The enable signal, which is generated by a pre-driver circuit in a typical application, also drives the input of inverter 26. Transistors 24 and 25 should each be sized such that there is no appreciable voltage drop across the devices.

Configured in this manner, the switching circuit comprising transistors 24 & 25 (along with inverter 26) turns driver 30 on by coupling node 28 to node 29 through transistor 24 responsive to a logical high signal applied to node 27. A logical low signal applied to node 27 turns transistor 24 off and transistor 25 on (via inverter 26), thereby grounding the gate of transistors 21–23, which turns driver 30 off. Hence, the composite resistor can be disabled when not required, as when releasing a GTL bus.

Figure 3:
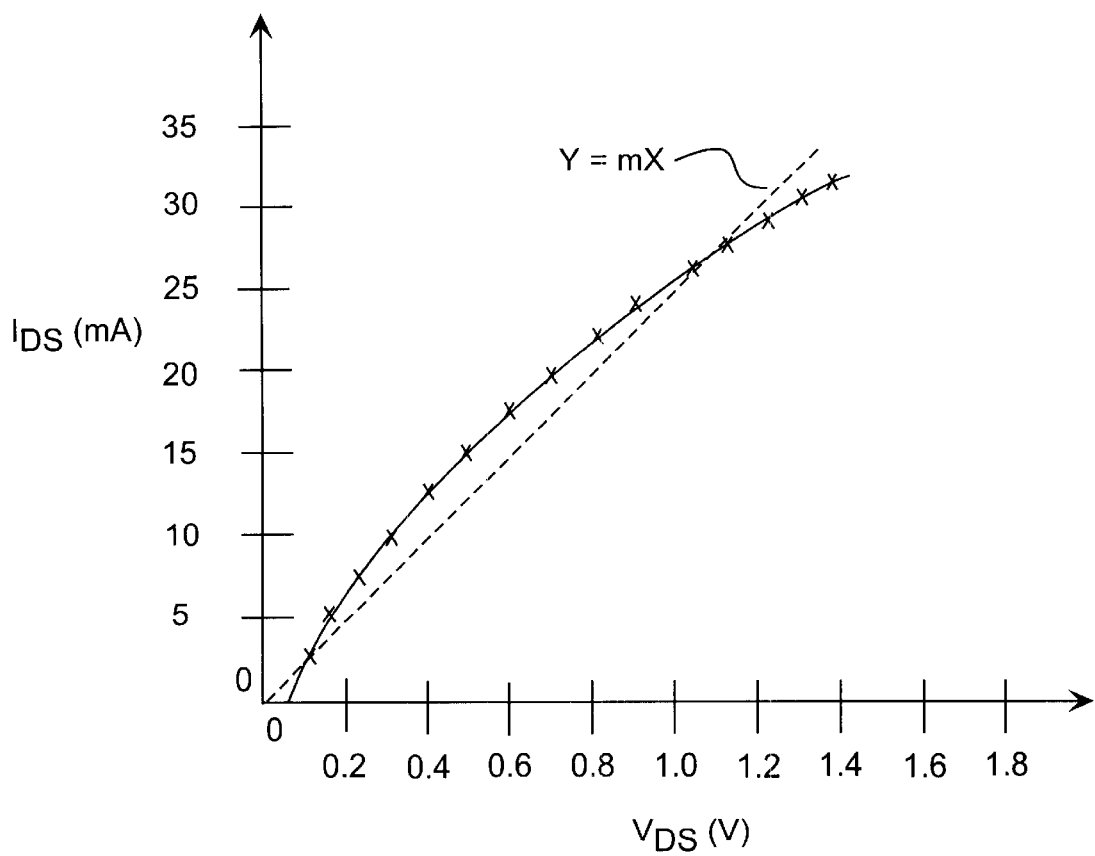
FIG. 3 is an example I-V plot of the linear active resistor structure according to one embodiment of the present invention.

To better understand and appreciate the present invention, an example I-V plot 33 of the linear active resistor structure implemented according to the present invention is shown in FIG. 3. This example uses Vt=0.4V, L=0.28 microns and $$\mu_N C_{OX}=0.34e^{-3} \quad \text{Equation (9)}$$

To compute approximate numerical values, the required operating point is defined as I=15 mA with V=0.75V, implying a resistance of 50 ohms. Equating $I_{DS}/V_{DS}=1/50=m$ from equation (6) and solving for $W_1$ produces $W_1=19$ microns. Inserting the computed value of $W_1$ in equation (8) results in a computed value of $W_2=2$ microns.

Practitioners familiar with the integrated circuit arts will further appreciate that in an actual IC chip, each of transistors 21–23 would typically be implemented as a set of parallel-configured transistors that could be selectively activated by ordinary control circuitry to adjust the impedance at the output node. For example, ten transistors (each 2 microns wide) connected in parallel may implement a single 20 micron wide transistor device 23. In this manner, the output impedance may be adjusted dynamically, with the impedance being dependent upon how many of the parallel-connected transistors are activated at any given time.

It is further appreciated that the present invention is also useful in analog applications requiring precision resistors, as in digital-to-analog (D/A) and analog-to-digital (A/D) converters, amplifiers, impedance transformers, etc.

We claim:

1. An active resistor comprising:
   a first node;
   an output node;

a first field-effect transistor (FET) coupled between a supply potential and the output node, the gate of the first FET being coupled to the first node;

second and third FETs coupled between the output node and a reference potential, the gate of the second FET being coupled to the first node, and the gate of the third FET being coupled to the output node;

application of a logically high voltage to the first node causing the second and third FETs to operate in linear and saturation modes, respectively, and the first FET to source a current to the output node, the first, second, and third FETs being sized such that a target impedance is maintained at the output node over a voltage range.

2. The active resistor of claim 1 wherein the current is a constant current.

3. The active resistor of claim 1 wherein the gate of the third FET is connected directly to the output node.

4. The active resistor of claim 1 further comprising a fourth FET coupled between the gate of the third FET and the output node.

5. The active resistor of claim 1 wherein the reference potential is ground and the supply potential is $V_{CC}$.

6. The active resistor of claim 1 wherein the second and third FETs both have a first width-to-length $(W/L)_1$ ratio.

7. The active resistor of claim 6 wherein the first FET has a second width-to-length $(W/L)_2$ ratio calculated as $$(W/L)_2 = (W/L)_1 V_t^2 / (V_{GS} - V_t)^2$$

where $V_t$ is a transistor threshold voltage and $V_{GS}$ is a gate-source voltage of the first FET.

8. A driver circuit comprising:
an input node;
an output node;
a first field-effect transistor (FET) coupled between a supply potential and the output node, the gate of the first FET being coupled to the input node;
second and third FETs coupled between the output node and a reference potential, the gate of the second FET being coupled to the input node;
a switching circuit that couples the gate of third FET to the output node in response to a signal at a first logic level applied to the input node, and to the reference potential in response to the signal at a second logic level applied to the input node;
wherein application of the signal at the first logic level to the input node causes the second FET to operate in a linear mode, the second FET to operate in a saturation mode, and the first FET to source a current to the output node, the first, second, and third FETs having a size relationship such that a target impedance is maintained at the output node over a voltage range.

9. The driver circuit of claim 8 wherein the switching circuit comprises:
a fourth FET coupled between the gate of the third FET and the output node, the gate of the fourth FET being coupled to the input node; and
a fifth FET coupled between the gate of the third FET and the reference potential, the gate of the fifth FET being coupled to receive a complement of the signal applied to the input node;
when the signal is at the first logic level, the gate of the third FET is coupled to the output node such that the driver circuit is in an on state, and when the signal is at the second logic level, the gate of the third FET is coupled to the reference potential such that the driver circuit is in an off state.

10. The driver circuit of claim 8 wherein the size relationship comprises the second and third FETs both having a first width-to-length $(W/L)_1$ ratio and the first FET having a second width-to-length $(W/L)_2$ ratio calculated as $$(W/L)_2 = (W/L)_1 V_t^2 / (V_{GS} - V_t)^2$$

where $V_t$ is a transistor threshold voltage and $V_{GS}$ is a gate-source voltage of the first FET.

11. The driver circuit of claim 8 wherein the reference potential is ground and the supply potential is $V_{CC}$.

12. The driver circuit of claim 8 wherein the current is a constant current.

13. A method of operation for a driver circuit comprising:
sinking from an output node of the driver a first current of a first transistor operated in a linear mode;
sinking from the output node a second current of a second transistor operated in a saturation mode;
sourcing into the output node a constant current of a third transistor, the first, second, and third FETs having a size relationship such that a target impedance is maintained at the output node over a voltage range.

14. The method of claim 13 wherein the constant current is equal to $$0.5\mu_N C_{OX}(W/L)_2(V_{GS}-V_t)^2 = 0.5\mu_N C_{OX}(W/L)_1 V_t^2$$

where $(W/L)_1$ is a width-to-length ratio, $C_{OX}$ is a gate capacitance, $V_t$ is a threshold voltage, $\mu_N$ is a mobility constant, and $V_{GS}$ is a gate-source voltage of the first and second transistors.

15. The method of claim 13 wherein the size relationship comprises the first and second transistors both having a first width-to-length $(W/L)_1$ ratio and the third transistor having a second width-to-length $(W/L)_2$ ratio calculated as $$(W/L)_2 = (W/L)_1 V_t^2 / (V_{GS} - V_t)^2$$

where $V_t$ is a transistor threshold voltage and $V_{GS}$ is a gate-source voltage of the third transistor.

16. The method of claim 13 further comprising:
alternately coupling the gate of the second transistor with the output node to switch the driver circuit on, and with a reference potential to switch the driver circuit off.

17. The method of claim 13 wherein the first, second, and third transistors are each NMOS field-effect transistors.

18. The method of claim 13 wherein the first current, $I_{DS}$ is calculated as $$I_{DS} = \mu_N C_{OX}(W/L)\{(V_{GS}-V_t)V_{DS} - 0.5 V_{DS}^2\}$$

where $V_t$ is a threshold voltage, $V_{DS}$ is a drain-source voltage, W/L is a width-to-length ratio, $C_{OX}$ is a gate capacitance, $\mu_N$ is a mobility constant, and $V_{GS}$ is a gate source voltage of the first transistor.

19. The method of claim 13 wherein the second current, $I_{DS}(sat)$ is calculated as $$I_{DS}(sat) = \mu_N C_{OX}(W/L)(V_{GS}-V_t)^2(1+\lambda V_{DS})$$

where $V_t$ is a threshold voltage, $V_{DS}$ is a drain-source voltage, W/L is a width-to-length ratio, $C_{OX}$ is a gate capacitance, $\mu_N$ is a mobility constant, and $V_{GS}$ is a gate-source voltage of the second transistor.

* * * * *